United States Patent
Liang et al.

(10) Patent No.: US 11,340,474 B2
(45) Date of Patent: May 24, 2022

(54) INTEGRATED DISPLAY PANEL, MANUFACTURING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Cuicui Liang, Beijing (CN); Bing Zhang, Beijing (CN); Wenjie Hu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 91 days.

(21) Appl. No.: 16/920,469

(22) Filed: Jul. 3, 2020

(65) Prior Publication Data
US 2021/0191144 A1    Jun. 24, 2021

(30) Foreign Application Priority Data
Dec. 20, 2019 (CN) .......................... 201911329645.9

(51) Int. Cl.
*G02B 30/28* (2020.01)
*H01L 27/32* (2006.01)
*G02B 5/30* (2006.01)
*H01L 51/52* (2006.01)

(52) U.S. Cl.
CPC ............ *G02B 30/28* (2020.01); *G02B 5/3025* (2013.01); *H01L 27/326* (2013.01); *H01L 27/3232* (2013.01); *H01L 51/5275* (2013.01); *H01L 51/5281* (2013.01)

(58) Field of Classification Search
CPC ............... H01L 27/326; H01L 51/5281; H01L 51/5275; G02B 30/27; G02B 30/28; G02B 30/29; H04N 13/305
See application file for complete search history.

(56) References Cited

U.S. PATENT DOCUMENTS

| | | | |
|---|---|---|---|
| 2007/0024970 A1* | 2/2007 | Lub .................. | C09K 19/60 |
| | | | 359/489.02 |
| 2011/0234079 A1* | 9/2011 | Eom .................. | G02B 5/3083 |
| | | | 313/112 |
| 2012/0327331 A1* | 12/2012 | Yim .................. | G02F 1/1362 |
| | | | 349/62 |
| 2013/0309411 A1* | 11/2013 | Kuwana ............. | G02B 1/041 |
| | | | 427/508 |
| 2015/0129852 A1* | 5/2015 | Park .................. | H01L 27/3262 |
| | | | 257/40 |
| 2016/0025991 A1* | 1/2016 | Johnson ............. | H04N 13/305 |
| | | | 348/58 |
| 2020/0013838 A1* | 1/2020 | Takechi ............. | H01L 51/5215 |

* cited by examiner

*Primary Examiner* — Alexander P Gross
(74) *Attorney, Agent, or Firm* — Thomas | Horstemeyer, LLP

(57) ABSTRACT

The present disclosure relates to an integrated display panel, a manufacturing method thereof, and a display device. The integrated display panel has a light emitting area and a transparent area, and includes: a transparent display layer including a display portion located in the light emitting area and a transparent portion located in the transparent area; a polarizing layer including a first alignment layer and a polarizing film; and a liquid crystal lens film layer including a second alignment layer and a liquid crystal lens layer.

20 Claims, 7 Drawing Sheets

INTEGRATED DISPLAY PANEL, MANUFACTURING METHOD THEREOF, AND DISPLAY DEVICE

CROSS-REFERENCE TO RELATED APPLICATION

The present application claims the priority to the Chinese Patent Application No. 201911329645.9, filed on Dec. 20, 2019, the contents of which being incorporated by reference in their entirety herein.

TECHNICAL FIELD

The present disclosure relates to the field of display technologies and, in particular, to an integrated display panel, a manufacturing method thereof, and a display device.

BACKGROUND

The human brain is an extremely complex nervous system. It produces a three-dimensional stereoscopic sense by performing, through the optic nerve center, a fusion reflex on two images having a parallax and transmits to both eyes while experiencing a visual psychological reaction. Using this principle, two left and right views with a parallax can be displayed on the display and split and then transferred to the left and right eyes, respectively, so as to obtain a three-dimensional sense and realize naked-eye three-dimensional display.

Naked-eye 3D (three-dimensional) displays are widely used in various fields such as advertising, media, demonstration teaching, exhibitions, and movies. Different from traditional binocular 3D display technology, the naked-eye 3D display has unique characteristics, that is, it does not require the audience to wear glasses or helmets to experience 3D effect. Further, due to realistic depth of field and stereoscopic sense, the naked-eye 3D display greatly improves the visual impact and immersion of the audience during the viewing experience, and becomes the best display product for product promotion, public promotion, and video playback.

Currently, a lens structure 10 separately manufactured is usually installed on a display panel 11 of a display device so as to realize the 3D display technology, as shown in FIG. 1. However, such method increases a thickness of the entire display device, and is not conducive to the development of ultra-thin display devices. Further, the light reflection of such display device is serious, which affects the display effect.

It should be noted that the information disclosed in the Background section above is only for enhancing the understanding of the background of the present disclosure, and thus may include information that does not constitute prior art known to those of ordinary skill in the art.

SUMMARY

The present disclosure aims to provide an integrated display panel, a method for manufacturing the same, and a display device, so as to realize the naked-eye 3D display and facilitate the development of ultra-thin display devices, and to reduce the light reflection and improve the display effect.

A first aspect of the present disclosure provides an integrated display panel having a light emitting area and a transparent area, and the integrated display panel includes:

a transparent display layer including a display portion located in the light emitting area and a transparent portion located in the transparent area;

a polarizing layer including a first alignment layer and a polarizing film, and the first alignment layer is formed on the transparent display layer and is located at least in the light emitting area, and the polarizing film is located in the light emitting area and is formed on a side of the first alignment layer facing away from the transparent display layer;

a liquid crystal lens film layer including a second alignment layer and a liquid crystal lens layer, and the second alignment layer is formed on the polarizing layer and is located at least in the light emitting area, the liquid crystal lens layer is located in the light emitting area and is formed on a side of the second alignment layer facing away from the transparent display layer; an optical axis of liquid crystal molecules in the liquid crystal lens layer and an absorption axis of liquid crystal molecules in the polarizing film are perpendicular to each other;

and the polarizing film is configured to absorb external ambient light reflected by the display portion; the liquid crystal lens layer is configured to transmit a left-eye image displayed in the display portion to a left eye of a viewer, and transmit a right-eye image displayed in the display portion to a right eye of the viewer.

In an exemplary embodiment of the present disclosure, the display panel has a plurality of light emitting areas and a plurality of transparent areas, and the light emitting areas and the transparent areas are alternately arranged;

the light emitting areas have a same structure, and the transparent areas have a same structure; and the display portion in each of the light emitting areas includes two columns of light emitting units, an image displayed by one of the two columns of light emitting units is transmitted to the left eye of the viewer through the liquid crystal lens layer, and an image displayed by the other of the two columns of light emitting units is transmitted to the right eye of the viewer through the liquid crystal lens layer.

In an exemplary embodiment of the present disclosure, each of the light emitting units includes driving device and an organic light emitting device coupled to the driving device.

In an exemplary embodiment of the present disclosure, adjacent organic light emitting devices are spaced apart from each other by a transparent pixel defining layer.

In an exemplary embodiment of the present disclosure, the polarizing film includes a composition of dichroic dyes and polymerizable liquid crystal molecules; and the first alignment layer has a first alignment direction.

The second alignment layer has a second alignment direction, and the second alignment direction is perpendicular to the first alignment direction.

In an exemplary embodiment of the present disclosure, the polarizing layer further includes a first phase difference film group. The first phase difference film group includes a first phase difference film and a third alignment layer, and the first phase difference film and the third alignment layer are at least located in the light emitting area.

The first phase difference film is located on a side of the first alignment layer close to the transparent display layer.

The third alignment layer is located on a side of the first phase difference film close to the transparent display layer, and the third alignment layer has a third alignment direction to control a slow axis direction of a liquid crystal molecule in the first phase difference film.

The third alignment direction is different from the first alignment direction and the second alignment direction.

In an exemplary embodiment of the present disclosure, the polarizing layer further includes a second phase difference film group. The second phase difference film group includes a second phase difference film and a fourth alignment layer, the second phase difference film and the fourth alignment layer are at least located in the light emitting area.

The second phase difference film is located on a side of the first alignment layer close to the transparent display layer.

The fourth alignment layer is located between the first phase difference film and the second phase difference film; the fourth alignment layer has a fourth alignment direction to control a slow axis direction of a liquid crystal molecule in the second phase difference film.

The fourth alignment direction is different from the first alignment direction, the second alignment direction, and the third alignment direction.

In an exemplary embodiment of the present disclosure, the first phase difference film is a quarter-wave phase difference film, and the second phase difference film is a half-wave phase difference film.

In an exemplary embodiment of the present disclosure, the first alignment layer, the second alignment layer, the first phase difference film group and the second phase difference film group are located in the light emitting area and the transparent area.

In an exemplary embodiment of the present disclosure, a transparent planarizing player is further included. The transparent planarizing player is located in the transparent area and is formed between the first alignment layer and the second alignment layer.

A second aspect of the present disclosure provides a method for manufacturing an integrated display panel, the integrated display panel has a light emitting area and a transparent area, and the method includes:

forming a transparent display layer, and the transparent display layer includes a display portion located in the light emitting area and a transparent portion located in the transparent area;

forming a first alignment layer on the transparent display layer, and the first alignment layer is located at least in the light emitting area;

forming a polarizing film located in the light emitting area on a side of the first alignment layer facing away from the transparent display layer;

forming a second alignment layer on a side of the polarizing film away facing from the first alignment layer, and the second alignment layer is located at least in the light emitting area;

forming a liquid crystal lens layer located in the light emitting area on a side of the second alignment layer facing away from the transparent display layer; an optical axis of liquid crystal molecules in the liquid crystal lens layer and an absorption axis of liquid crystal molecules in the polarizing film are perpendicular to each other; and the polarizing film is configured to absorb external ambient light reflected by the display portion; the liquid crystal lens layer is configured to transmit a left-eye image displayed in the display portion to a left eye of a viewer, and transmit a right-eye image displayed in the display portion to a right eye of the viewer.

In an exemplary embodiment of the present disclosure, forming a liquid crystal lens layer located in the light emitting area on a side of the second alignment layer facing away from the transparent display layer includes:

coating a polymerizable liquid crystal mixture on the side of the second alignment layer away from the transparent display layer;

forming the liquid crystal lens layer located in the light emitting area by imprinting the polymerizable liquid crystal mixture through a lens model and curing the polymerizable liquid crystal mixture through an ultraviolet curing process.

A third aspect of the present disclosure provides a display device including the integrated display panel described in any one of the above.

The technical solutions provided by the present disclosure can achieve the following beneficial effects.

According to the integrated display panel and the method for manufacturing the same, and the display device provided by the present disclosure, the liquid crystal lens layer and the polarizing film are integrated in the light emitting area, thereby solving the problem in the related art that the entire display device is excessively thick because the lens structure is installed on the display panel as a separate member, and also solving the problem in the related art that the display effect is poor due to the serious light reflection of the display device Therefore, by adopting the integrated display panel of the present disclosure, the thickness of the entire display device may be reduced, facilitating the development of ultra-thin display devices, solving the light reflection problem and improving the display effect.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

In FIG. 1:
10, lens structure; 11, display panel.
In FIG. 2 to FIG. 14:
2, integrated display panel; 20, substrate; 21, driving device; 22, first electrode; 23, light emitting layer; 24, second electrode; 25, transparent pixel defining layer; 26, transparent portion; 27, encapsulating film; 28, third alignment layer; 29, first phase difference film; 30, fourth alignment layer; 31, second phase difference film; 32, first alignment layer; 33, polarizing film; 34, transparent planarizing player; 35, second alignment layer; 36, liquid crystal lens layer.

DETAILED DESCRIPTION

Figure 1:
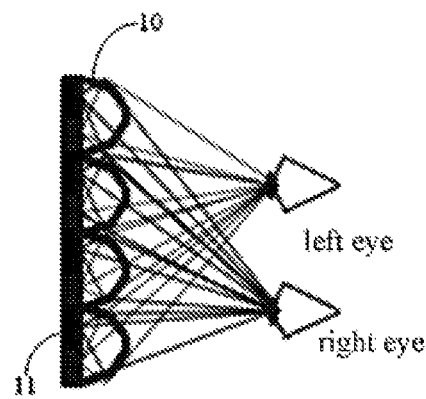
FIG. 1 is a schematic diagram showing a display device in the related art.

Example embodiments will now be described more fully with reference to the accompanying drawings. However, the embodiments can be implemented in a variety of forms and should not be construed as being limited to the examples set forth herein; rather, these embodiments are provided so that this disclosure will be more complete so as to convey the idea of the exemplary embodiments to those skilled in this art. The same reference numerals in the drawings denote the same or similar parts, and the detailed description thereof will be omitted.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described "above" will become the component "below". When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" is used to indicate that there are one or more elements/components or the like; the terms "include" and "have" are used to indicate an open type meaning of including and means that there may be additional elements/components/etc. in addition to the listed elements/components/etc.; the terms "first", "second", "third" and "fourth" etc. are used only as markers, and do not limit the number of objects.

Figure 2:
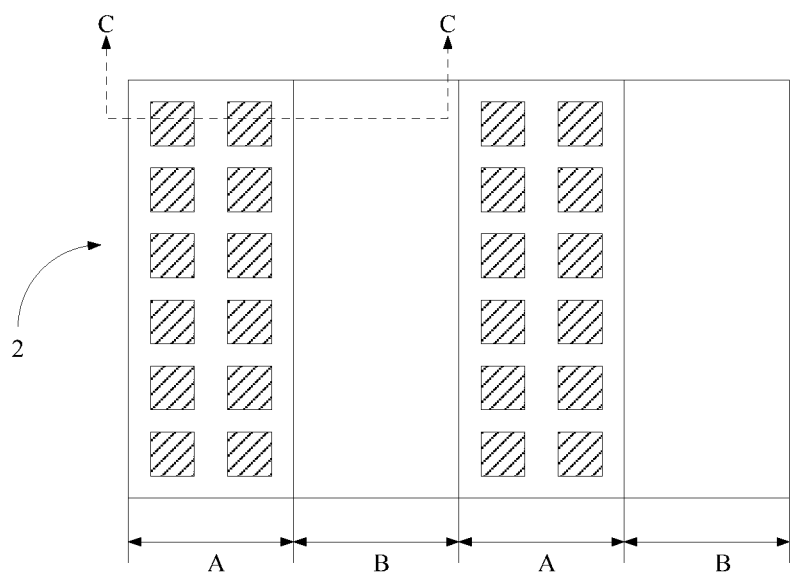
FIG. 2 is a top view of an integrated display panel according to an embodiment of the present disclosure.

As shown in FIG. 2, an embodiment of the present disclosure provides an integrated display panel 2 that has light emitting areas A and transparent areas B. Specifically, the integrated display panel 2 may include a transparent display layer, a polarizing layer, and a liquid crystal lens film layer.

Figure 3:
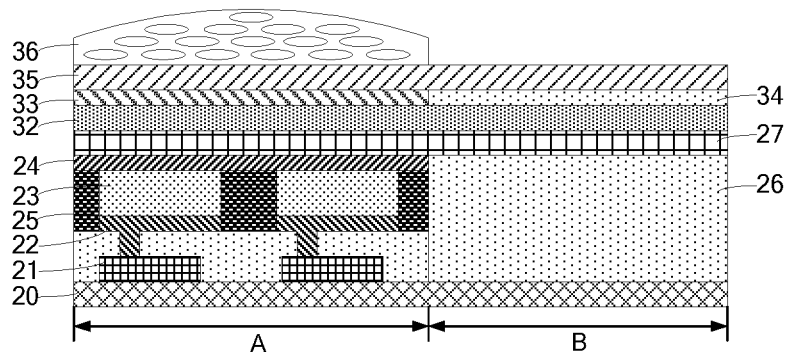
FIG. 3 is a schematic cross-sectional view of the integrated display panel according to the embodiment shown in FIG. 2 in a C-C direction.

As shown in FIG. 3, the transparent display layer may include a display portion located in the light emitting area A and a transparent portion 26 located in the transparent area B. The polarizing layer may include a first alignment layer 32 and a polarizing film 33. The first alignment layer 32 is formed on the transparent display layer and is located at least in the light emitting area A, and the polarizing film 33 is located in the light emitting area A and is formed on a side of the first alignment layer 32 facing away from the transparent display layer. The liquid crystal lens film layer may include a second alignment layer 35 and a liquid crystal lens layer 36. The second alignment layer 35 is formed on the polarizing layer and is located at least in the light emitting area A, and the liquid crystal lens layer 36 is located in the light emitting area A and is formed on a side of the second alignment layer 35 facing away from the transparent display layer. An optical axis of liquid crystal molecules in the liquid crystal lens layer 36 and an absorption axis of liquid crystal molecules in the polarizing film 33 are perpendicular to each other. The polarizing film 33 may absorb external ambient light reflected by the display portion. The liquid crystal lens layer 36 is configured to transmit a left-eye image displayed in the display portion to a left eye of a viewer, and transmit a right-eye image displayed in the display portion to a right eye of the viewer.

In this embodiment, the integrated display panel 2 is integrated with the liquid crystal lens layer 36 and the polarizing film 33 in the light emitting areas A, thereby solving the problem in the related art that the entire display device is excessively thick because the lens structure is installed on the display panel as a separate member, and also solving the problem in the related art that the display effect is poor due to the serious light reflection of the display device. Therefore, by adopting the integrated display panel 2 of the present disclosure, the thickness of the entire display device may be reduced, facilitating the development of ultra-thin display devices. Further, the light reflection is reduced and the display effect is improved.

The structure of the integrated display panel of the present disclosure will be described in detail below with reference to the drawings.

As shown in FIG. 2, the integrated display panel 2 may be provided with a plurality of light emitting areas A and a plurality of transparent areas B, and the light emitting areas A and the transparent areas B are alternately arranged in a row direction to improve the naked-eye 3D display effect. The light emitting areas A have the same structure, and the transparent areas B have the same structure.

Optionally, as shown in FIGS. 2 and 3, the display portion in each light emitting area includes two columns of light emitting units, an image displayed by one of the two columns of light emitting units is transmitted to the left eye of the viewer through the liquid crystal lens layer 36, and an image displayed by the other of the two columns of light emitting units is transmitted to the right eye of the viewer through the liquid crystal lens layer 36. However, it is not limited to this, and more columns may be provided depending on the specific situation.

Further, the light emitting unit may include a driving device 21 and an organic light emitting device (i.e., an OLED device) connected to the driving device 21. That is to say, the integrated display panel 2 may be an OLED (Organic Light emitting Diode) display, and it facilitates to manufacture a flexible display device to expand its scope of application, compared with a LCD (i.e., liquid crystal) display.

In detail, the driving device 21 may adopt a passive matrix (PM) driving mode, or adopt an active matrix (AM) driving mode or a semi-active matrix driving mode, which depends on design requirements, and is not limited here. In this embodiment, the driving device 21 may adopt the AM driving mode. In this embodiment, the driving device 21 may include a thin film transistor and a metal wiring portion (not shown in the figure). It should be noted that since the driving device 21 is not the main improvement point of the present disclosure, detailed descriptions are not made to it in this embodiment, and the specific structure of this thin film transistor can refer to the related art.

As shown in FIG. 3, the organic light emitting device may include a first electrode 22, a second electrode 24, and a light emitting layer 23 disposed between the first electrode 22 and the second electrode 24. The first electrode 22 is disposed on a side of the light emitting layer 23 close to the substrate 20, and is connected to the driving device 21, specifically can be connected to the source and drain of the thin film transistor in the driving device 21. The second electrode 24 is disposed on a side of the light emitting layer 23 facing away from the substrate 20. The light emitted by the light emitting layer 23 exits through the second electrode 24. Optionally, if the integrated display panel 2 provided in this embodiment is a top-emitting type, the first electrode 22 may be an anode, and the second electrode 24 may be a cathode. If the display panel provided in this embodiment is a bottom-emitting type, the first electrode 22 may be a cathode, and the second electrode 24 may be an anode. It can be designed according to actual needs and is not limited here.

In addition, in this embodiment, adjacent organic light emitting devices may be spaced apart from each other by a transparent pixel defining layer 25. The material of the transparent pixel defining layer 25 may be PI (polyimide) material to improve a transparent area of the integrated display panel 2.

Optionally, the material of the transparent portion 26 in each transparent area B may be a transparent PI (polyimide) material or an OC (organic resin) material, but is not limited thereto, and may also be other transparent materials.

It should be understood that, as shown in FIG. 3, the transparent display layer includes not only the display portion and the transparent portion 26, but also includes the substrate 20 and the encapsulating film 27. The display portion and the transparent portion 26 may be formed on the substrate 20, and the encapsulating film 27 may cover the display portion and the transparent portion 26. The substrate 20 can be a transparent substrate. For example, the material of the substrate 20 may be a transparent PI material, but it is not limited thereto, and may also be other transparent materials. In addition, the substrate 20 may have a single-layer structure or a multi-layer structure. The encapsulating film 27 may be a transparent encapsulating film 27. For example, the material of the encapsulating film 27 may include a transparent inorganic material and an organic material. Optionally, the encapsulating film 27 may include at least one transparent organic encapsulating film and at least one transparent inorganic encapsulating film. When the organic encapsulating film and the inorganic encapsulating film are multiple layers, the organic encapsulating films and the inorganic encapsulating films may be alternately arranged.

In this embodiment, when the integrated display panel 2 is used, after external ambient light is irradiated into the panel, the driving device 21 and the organic light emitting device located in the display portion of the light emitting area A will reflect the external ambient light irradiated on the surfaces of the driving device 21 and the organic light emitting device. The external ambient light is mainly reflected by the second electrode 24 in the organic light emitting device. In the display panel provided in this embodiment, since the polarizing film 33 can absorb the external ambient light reflected by the display portion, the light reflectance of the display portion can be reduced. In addition, since the transparent area B does not have the polarizing film 33, the light transmittance of the transparent area B is not affected. Therefore, the display effect of the integrated display panel 2 is improved, while the transparency of the integrated display panel 2 is not affected.

Figure 12:
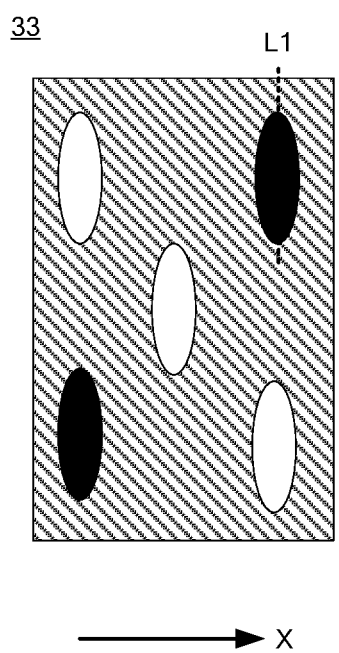
FIG. 12 is a top view of a polarizing film in the integrated display panel according to an embodiment of the present disclosure.

As shown in FIG. 12, the polarizing film 33 may include a composition of a dichroic dye and polymerizable liquid crystal molecules. The dichroic dye has an absorption axis L1 (in this embodiment, a direction of the absorption axis L1 of the dichroic dye is parallel to a direction of the transparent display layer). If the external ambient light irradiates the dichroic dye, the light in the external ambient light parallel to the absorption axis L1 of the dichroic dye will be absorbed by the dichroic dye, and the light perpendicular to the absorption axis L1 of the dichroic dye may be transmitted through the dichroic dye. The dichroic dye may be connected to the liquid crystal molecules by grafting onto the liquid crystal molecules, so that the liquid crystal molecules have dichroism. The dichroic dye shows various light absorption characteristics are determined according to its dye structures, and the dichroic dye generally absorbs specific wavelengths (such as red, blue, and yellow) making it difficult to display black using a single dye.

For this reason, three or more of multiple dichroic dyes are generally mixed to display black. In general, the wavelength of visible light is considered to be within a range of 380 nm to 780 nm, and if the light absorption is constant in this range, it is considered to be "black". However, considering a standard visual sensitivity curve of dark adaptability versus human visual sensitivity, the light absorption is desirably constant in the wavelength range of 400 nm to 650 nm. Therefore, the dichroic dye is selected as follows: first, the dichroic dye composition capable of absorbing wavelength within a range of 450 nm to 650 nm can be selected; second, the dichroic dye has a sufficiently high solubility in the liquid crystal.

Figure 11:
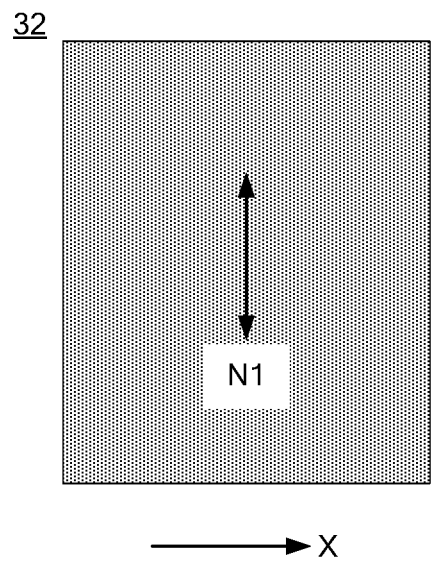
FIG. 11 is a top view of a first alignment layer in the integrated display panel according to an embodiment of the present disclosure.

As shown in FIG. 11, the first alignment layer 32 has a first alignment direction N1. The first alignment layer 32 is configured to control an arrangement direction of liquid crystal molecules in the polarizing film 33. Specifically, the first alignment layer 32 is configured to control the direction of the absorption axis L1 of the liquid crystal molecule in the polarizing film 33 to be the same as the first alignment direction N1. For example, if an angle between the first alignment direction N1 and a direction X parallel to a lower side of the integrated display panel 2 is 90 degrees, an angle between the absorption axis L1 of the liquid crystal molecule in the polarizing film 33 and the direction X parallel to the lower side of the integrated display panel 2 is 90 degrees.

The liquid crystal lens layer 36 is a lens structure composed of liquid crystal molecules. Light from the images for left and right eyes passes through the liquid crystal lens layer 36, and then split through light refraction to be transmitted to left and right eyes of the viewer, so that the viewer can see a three-dimensional image.

Figure 13:
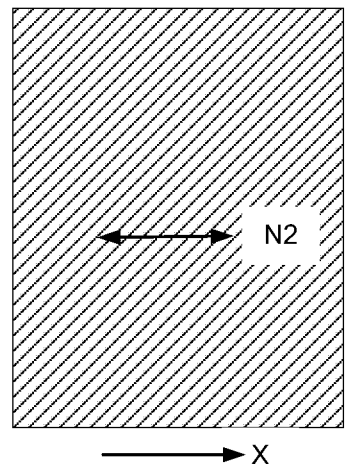
FIG. 13 is a top view of a second alignment layer in the integrated display panel according to an embodiment of the present disclosure.
Figure 14:
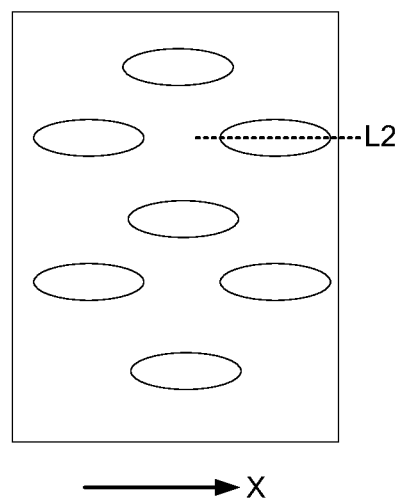
FIG. 14 is a top view of a liquid crystal lens layer in the integrated display panel according to an embodiment of the present disclosure.

For example, when the liquid crystal lens layer 36 and the transparent display layer are designed, special attention needs to be paid to the followings:

Firstly, as shown in FIG. 14, incident light of the liquid crystal lens layer 36 must be linearly polarized light, and the polarization direction needs to be consistent with the optical axis L2 of the liquid crystal molecules (when the liquid crystal molecules are positive optical liquid crystals, a long axis of the liquid crystal molecules is the optical axis L2) in the liquid crystal lens layer 36. Specifically, when the angle between the absorption axis L1 of the liquid crystal molecules in the polarizing film 33 and the direction X parallel to the lower side of the integrated display panel 2 is 90 degrees, an angle between the optical axis L2 of the liquid crystal molecules in the liquid crystal lens layer 36 and the direction X parallel to the lower side of the integrated display panel 2 may be 0 degrees. In order to make the angle between the optical axis L2 of the liquid crystal molecules in the liquid crystal lens layer 36 and the direction X parallel to the lower side of the integrated display panel 2 be 0 degree, as shown in FIG. 13, the second alignment layer 35 should have a second alignment direction N2, and an angle between the second alignment direction N2 and the direction X parallel to the lower side of the integrated display panel 2 may be 0 degree. That is, the second alignment direction N2 may be perpendicular to the first alignment direction N1.

Figure 4:
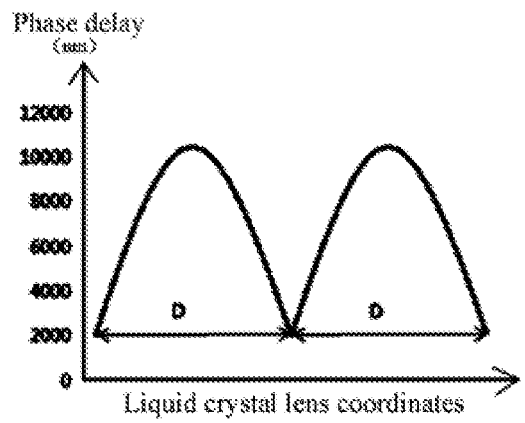
FIG. 4 shows an optical path difference distribution of a liquid crystal lens layer in the integrated display panel according to an embodiment of the present disclosure.

Secondly, as for requirements for focusing, in order to enable the display image of the transparent display layer to be formed on the left and right eyes of the viewer, an image plane of the transparent display layer should be located on a focal plane of the liquid crystal lens layer 36. Further, in order to avoid the left-eye image entering the right eye and the right-eye image entering the left eye, the liquid crystal lens layer 36 is required to meet an optical path difference distribution of a standard parabolic lens. The approximate graph of the optical path difference distribution of the liquid crystal lens is shown in FIG. 4, where data in the graph is just for principle explanation, not specific design values, and D is a size of an opening of each liquid crystal lens unit.

In this embodiment, the polarizing layer further includes at least one phase difference film group disposed between the first alignment layer 32 and the transparent display layer. The phase difference film group may include an alignment layer and a phase difference film. It should be noted that, if multiple phase difference film groups are provided between the first alignment layer 32 and the transparent display layer, alignment directions of alignment layers in respective phase difference film groups should be different from each other and arrangement directions of liquid crystal molecules in respective phase difference films should be different from each other.

Figure 5:
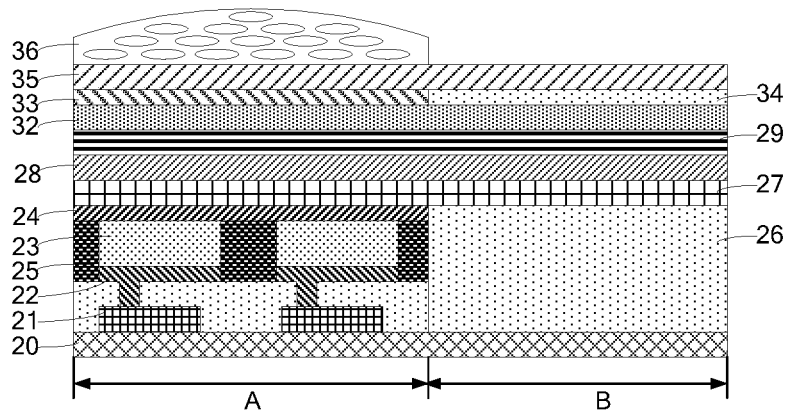
FIG. 5 is a schematic cross-sectional view of an integrated display panel according to another embodiment shown in FIG. 2 in a C-C direction.
Figure 7:
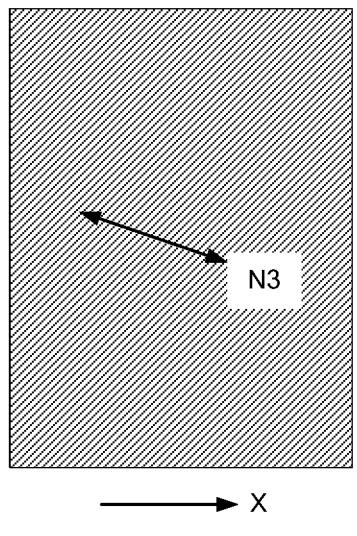
FIG. 7 is a top view of a third alignment layer in the integrated display panel according to an embodiment of the present disclosure.

Optionally, the polarizing layer may include a first phase difference film group, as shown in FIG. 5, the first phase difference film group may include a first phase difference film 29 and a third alignment layer 28. The first phase difference film 29 and the third alignment layer 28 are located at least in the light emitting area A. The first phase difference film 29 is located on the side of the first alignment layer 32 close to the transparent display layer, and the third alignment layer 28 is located on a side of the first phase difference film 29 close to the transparent display layer. As shown in FIG. 7, the third alignment layer 28 has a third alignment direction N3, which is different from the first alignment direction N1 and the second alignment direction N2.

Figure 8:
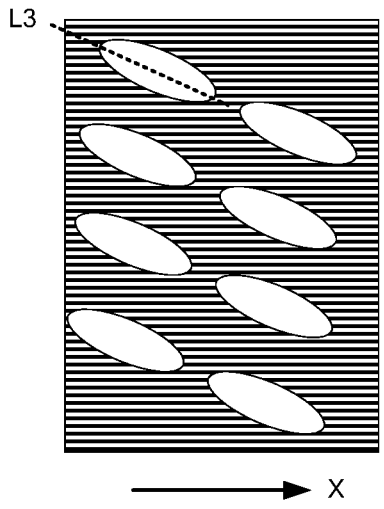
FIG. 8 is a top view of a first phase difference film in the integrated display panel according to an embodiment of the present disclosure.

For example, as shown in FIG. 7, an angle between the third alignment direction N3 and the direction X parallel to the lower side of the integrated display panel 2 may be 165 degrees. When the liquid crystal molecules in the first phase difference film 29 are positive optical liquid crystals, as shown in FIG. 8, an angle between a slow axis L3 (i.e., a long axis) of the liquid crystal molecules in the first phase difference film 29 and the direction X parallel to the lower side of the integrated display panel 2 may be 165 degrees.

In this embodiment, according to the third alignment direction N3, the direction of the slow axis L3 of the liquid crystal molecules in the first phase difference film 29 is controlled to be in an arrangement direction parallel to the transparent display layer, so that the first phase difference film 29 can be made to increase the light absorption rate of the polarizing film 33.

Specifically, in the light emitting area A of the integrated display panel 2 of this embodiment, the external ambient light passes through the liquid crystal lens layer 36, the second alignment layer 35, the polarizing film 33, and the first alignment layer 32 in sequence. Since the light in the external ambient light parallel to the absorption axis L1 of the liquid crystal molecules in the polarizing film 33 is absorbed, and the light perpendicular to the absorption axis L1 of the liquid crystal molecules in the polarizing film 33 is transmitted, the external ambient light becomes a first linearly polarized light after passing through the polarizing film 33 and the first alignment layer 32. A direction of the first linearly polarized light is perpendicular to the absorption axis L1 of the liquid crystal molecules in the polarizing film 33. After passing through the first phase difference film 29, the first linearly polarized light becomes elliptically polarized light. The elliptically polarized light is irradiated onto the organic light emitting device and the driving device 21, reflected by the organic light emitting device and the driving device 21, and then passes through the first phase difference film 29 again to become a second linearly polarized light. A direction of the second linearly polarized light is parallel to the absorption axis L1 of the liquid crystal molecules in the polarizing film 33, and the second linearly polarized light is absorbed by the liquid crystal molecules in the polarizing film 33. The direction of the first linearly polarized light is perpendicular to the direction of the second linearly polarized light. That is, after the external ambient light becomes the first linearly polarized light by being absorbed by the polarizing film 33 for the first time, the first phase difference film group changes the first linearly polarized light perpendicular to the absorption axis L1 of the liquid crystal molecules in the polarizing film 33 to the second linearly polarized light parallel to the absorption axis L1 of the liquid crystal molecules in the polarizing film 33, so that the second linearly polarized light will be absorbed again by the polarizing film 33. Therefore, the first phase difference film 29 can increase the light absorption rate of the polarizing film 33, thereby further reducing the light reflectance of the light emitting area A.

In this embodiment, the first phase difference film 29 may be a quarter-wave phase difference film.

Figure 6:
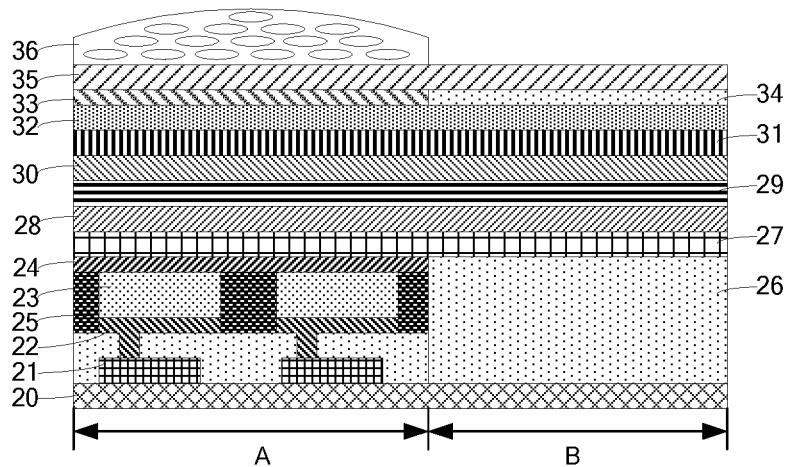
FIG. 6 is a schematic cross-sectional view of an integrated display panel according to still another embodiment shown in FIG. 2 in a C-C direction.
Figure 9:
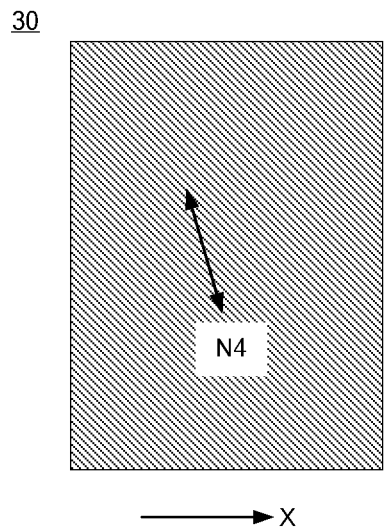
FIG. 9 is a top view of a fourth alignment layer in the integrated display panel according to an embodiment of the present disclosure.
Figure 10:
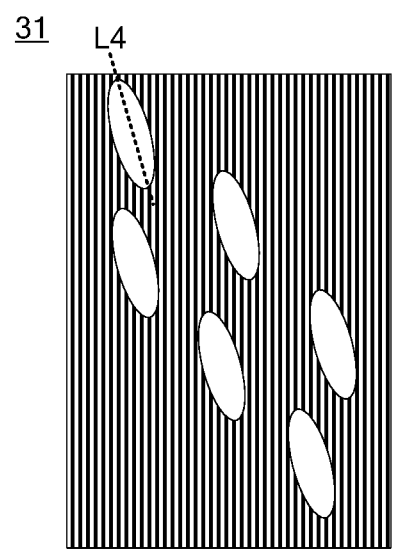
FIG. 10 is a plan view of a second phase difference film in the integrated display panel according to an embodiment of the present disclosure.

Further, the polarizing layer further includes a second phase difference film group. As shown in FIG. 6, the second phase difference film group includes a second phase difference film 31 and a fourth alignment layer 30. The second phase difference film 31 and the fourth alignment layer 30 is located at least in the light emitting area A. The second phase difference film 31 is located on the side of the first alignment layer 32 close to the transparent display layer, and the fourth alignment layer 30 is located between the first phase difference film 29 and the second phase difference film 31. As shown in FIGS. 9 and 10, the fourth alignment layer 30 has a fourth alignment direction N4 to control a direction of a slow axis L4 of the liquid crystal molecules in the second phase difference film 31. The fourth alignment direction N4, the first alignment direction N1, the second alignment direction N2, and the third alignment direction N3 are different.

For example, an angle between the fourth alignment direction N4 and the direction X parallel to the lower side of the integrated display panel 2 may be 105 degrees. When the liquid crystal molecules in the second phase difference film 31 are positive optical liquid crystals, an angle between the slow axis L4 (i.e., the long axis) of the liquid crystal molecules in the second phase difference film 31 and the direction X parallel to the lower side of the integrated display panel 2 may be 105 degrees.

In this embodiment, according to the fourth alignment direction N4, the slow axis of the liquid crystal molecules in the second phase difference film 31 is controlled to be in the arrangement direction parallel to the transparent display layer, so that the second phase difference film 31 can reduce the color shift of the integrated display panel 2.

Specifically, in the light emitting area A of the integrated display panel 2 of this embodiment, the polarized light generated by the external ambient light after passing through the polarizing film 33 and the first phase difference film 29 may has a phase delay and become monochromatic light. As a result, color shift may occur on the integrated display panel 2 after the external ambient light is reflected by the organic light emitting device and the driving device 21. In view of this matter, the second phase difference film 31 is added between the polarizing film 33 and the first phase difference film 29. In this way, the external ambient light becomes the first linearly polarized light after passing through the polarizing film 33, and then passes through the second phase difference film 31. The second phase difference film 31 deflects the angle of the first linearly polarized light, and then cooperates with the first phase difference film 29 to change the deflection direction of the first linearly polarized light, thereby solving the color shift problem.

It should be noted that the liquid crystal molecules in the first phase difference film 29 and the second phase difference film 31 do not have dichroism, so the external ambient light irradiated on the first phase difference film 29 and the second phase difference film 31 is not absorbed by the first phase difference film 29 and the second phase difference film 31, and the external ambient light can directly pass through the first phase difference film 29 and the second phase difference film 31 without affecting the transmittance of the light emitting area A.

In this embodiment, the second phase difference film 31 is a half-wave phase difference film.

Since the first alignment layer 32, the second alignment layer 35, the first phase difference film group and the second phase difference film group do not absorb the external ambient light, the first alignment layer 32, the second alignment layer 35, the first phase difference film group and the second phase difference film group may be located in the light emitting area A and the transparent area B, that is, the first alignment layer 32, the second alignment layer 35, the first phase difference film group and the second phase difference film group may cover the entire transparent display area, which can reduce the patterning process, and can simplify the production process and improve production efficiency.

In addition, in order not to affect the transmittance of the transparent area B in the integrated display panel 2, the polarizing film 33 is not provided in the transparent area B. In order to make the display structure tends to be flattened before the liquid crystal lens film is manufactured, as shown in FIGS. 3, 5 and 6, the integrated display panel 2 of this embodiment may further include a transparent planarizing player 34, which is located in the transparent area B, and is formed between the first alignment layer 32 and the second alignment layers 35. For example, the material of the transparent planarizing player 34 may be an OC material or a PI material. Of course, it may be other materials, as long as the material used does not affect the transparency of the display panel, which is not limited herein.

Figure 15:
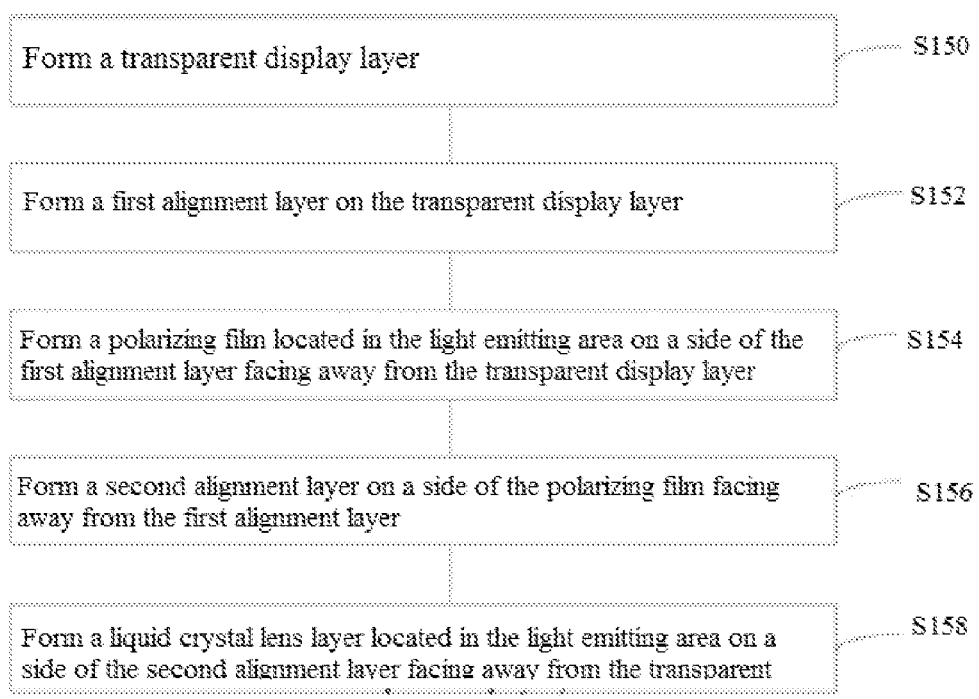
FIG. 15 is a flowchart of a method for manufacturing the integrated display panel according to an embodiment of the present disclosure.

Correspondingly, embodiments of the present disclosure further provide a method for manufacturing an integrated display panel. The integrated display panel has a light emitting area and a transparent area. As shown in FIG. 15, the method may include steps described below.

In step S150, a transparent display layer is formed. The transparent display layer includes a display portion located in the light emitting area and a transparent portion located in the transparent area.

In step S152, a first alignment layer is formed on the transparent display layer. The first alignment layer is located at least in the light emitting area.

In step S154, a polarizing film located in the light emitting area is formed on a side of the first alignment layer facing away from the transparent display layer.

In step S156, a second alignment layer is formed on a side of the polarizing film facing away from the first alignment layer, and the second alignment layer is located at least in the light emitting area.

In step S158, a liquid crystal lens layer located in the light emitting area is formed on a side of the second alignment layer facing away from the transparent display layer. An optical axis of liquid crystal molecules in the liquid crystal lens layer and a absorption axis of liquid crystal molecules in the polarizing film are perpendicular to each other.

The polarizing film is capable of absorbing external ambient light reflected by the display portion. The liquid crystal lens layer is configured to transmit a left-eye image displayed in the display portion to a left eye of a viewer, and transmit a right-eye image displayed in the display portion to a right eye of the viewer.

It should be understood that for the structure and material selection of the integrated display panel manufactured by this method, reference may be made to the description of the integrated display panel in the foregoing embodiment, and therefore, in this embodiment, the specific structure, material selection and beneficial effects of the integrated display panel will not be described in detail.

Each step is described in detail below.

In step S150, a transparent display layer is formed. The transparent display layer includes a display portion located in the light emitting area and a transparent portion located in the transparent area.

Specifically, a PI substrate may be manufactured first. Then, the driving device and the organic light emitting device are sequentially manufactured on the light emitting area of the substrate to form the display portion, and the transparent portion is manufactured in the transparent area of the substrate. Next, the encapsulating film covering the display portion and the transparent portion is manufactured. The manufacturing process of the driving device and the organic light emitting device is relatively mature, and will not be described in detail here.

In step S152, a first alignment layer is formed on the transparent display layer. The first alignment layer is located at least in the light emitting area.

Specifically, the PI material is coated on the light emitting side of the transparent display layer and cured to form the first alignment layer, and then the first alignment layer is irradiated with UV (ultraviolet) to make the polymer in the first alignment layer with the alignment capability, thereby forming the first alignment layer having the first alignment direction.

In step S154, a polarizing film located in the light emitting area is formed on a side of the first alignment layer facing away from the transparent display layer.

Specifically, a mixture of the dichroic dye and polymerizable liquid crystal molecules is coated on a portion, which is located in the light emitting area, of a surface of the first alignment layer facing away from the transparent display layer to form the polarizing film. Both ends of the polymerizable liquid crystal molecules may include photopolymerization reaction groups, when the ultraviolet light is irradiated to the photopolymerization reaction groups, a polymerization reaction occurs to form the optical axis of liquid crystal molecule. The polarizing film is irradiated with UV again to cure the polarizing film, so that the absorption axes of the liquid crystal molecules in the polarizing film are arranged in the first alignment direction.

In step S156, a second alignment layer is formed on a side of the polarizing film facing away from the first alignment layer. The second alignment layer is located at least in the light emitting area.

Specifically, the PI material is coated on the side of the polarizing film facing away from the first alignment layer, and is cured to form the second alignment layer. Then, the second alignment layer is irradiated with UV (ultraviolet) to make the polymer in the second alignment layer with the alignment capability to form the second alignment layer with the second alignment direction.

It should be noted that, before the second alignment layer is formed, in order to ensure planarization, a transparent planar layer may be formed on a portion of the first alignment layer, that is located in the transparent area and arranged on the side of the first alignment layer facing away from the transparent display layer.

In step S158, a liquid crystal lens layer located in the light emitting area is formed on a side of the second alignment layer facing away from the transparent display layer. An optical axis of liquid crystal molecules in the liquid crystal lens layer and a absorption axis of liquid crystal molecules in the polarizing film are perpendicular to each other.

Specifically, step S158 may include steps described below.

In step S1580, a polymerizable liquid crystal mixture is coated on the side of the second alignment layer facing away from the transparent display layer.

In step S1582, the polymerizable liquid crystal mixture is imprinted with a lens model, and the polymerizable liquid crystal mixture is cured through an ultraviolet curing process to form the liquid crystal lens layer located in the light emitting area.

After step S150 and before step S152, step S151 may be further included. In step S151, a third alignment layer, a first phase difference film, a fourth alignment layer, and a fourth phase difference film are sequentially formed on the light emitting side of the transparent display layer. Specifically, first, PI may be coated on the side of the encapsulating film facing away from the substrate and be cured to form a third alignment layer, and then the third alignment layer is irradiated with UV to make the polymer in the third alignment layer with the alignment capability to form the third alignment layer with the second alignment direction. Next, polymerizable liquid crystal with a quarter-wave phase difference is coated on the side of the third alignment layer facing away from the substrate to form a first phase difference film, and then the first phase difference film is irradiated with UV, so that the first phase difference film is cured to make the liquid crystal molecules in the first phase difference film be arranged in the third alignment direction in the third alignment layer. Next, the PI is coated on a side of the first phase difference film facing away from the substrate and is cured to form a fourth alignment layer, and then the fourth alignment layer is irradiated with UV to make the polymer in the second alignment layer with the alignment capability to form the fourth alignment direction of the fourth alignment layer. Finally, the polymerizable liquid crystal with a half-wave phase difference is coated on the side of the fourth alignment layer facing away from the substrate to form a second phase difference film, and then the second phase difference film is irradiated with UV to cure the second phase difference film to make the liquid crystal molecules in the second phase difference film be arranged in the fourth alignment direction in the fourth alignment layer.

An embodiment of the present disclosure further provides a display device including any integrated display panel 2 described above.

According to the embodiments of the present disclosure, the specific type of the display device is not particularly limited, and the types of display devices commonly used in the art may be used, for example any product or component having a display function, such as a tablet computer, a television, a display, a notebook computer, a digital photo frame, a navigator, and the like. The display device can also be used for transparent display in shopping malls, which can increase the sense of three-dimensional realism, technology, coolness, etc. Those skilled in the art can choose accordingly according to the specific use of the display device, which is not repeated here.

It should be noted that, in addition to the integrated display panel 2, the display device further includes other necessary components. Taking a display as an example, the display includes a housing, a power source line and so on, which can be supplemented according to the specific use requirements of the display device by those skilled in the art, and will not be repeated here.

It should be noted that although the various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on, which are all a portion of the present disclosure.

It should be understood that the present disclosure is not limited to the detailed structure and arrangement of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the invention and will enable those skilled in the art to utilize the present disclosure.

What is claimed is:

1. An integrated display panel having a light emitting area and a transparent area, wherein the integrated display panel comprises:
   a transparent display layer comprising a display portion located in the light emitting area and a transparent portion located in the transparent area;
   a polarizing layer comprising a first alignment layer and a polarizing film, wherein the first alignment layer is formed on the transparent display layer and is located at least in the light emitting area, and the polarizing film is located in the light emitting area and is formed on a side of the first alignment layer facing away from the transparent display layer; and
   a liquid crystal lens film layer comprising a second alignment layer and a liquid crystal lens layer, wherein the second alignment layer is formed on the polarizing layer and is located at least in the light emitting area, the liquid crystal lens layer is located in the light emitting area and is formed on a side of the second alignment layer facing away from the transparent display layer; and an optical axis of liquid crystal molecules in the liquid crystal lens layer and an absorption axis of liquid crystal molecules in the polarizing film are perpendicular to each other;
   wherein the polarizing film is configured to absorb external ambient light reflected by the display portion; the liquid crystal lens layer is configured to transmit a left-eye image displayed in the display portion to a left eye of a viewer, and transmit a right-eye image displayed in the display portion to a right eye of the viewer.

2. The integrated display panel according to claim 1, wherein:
   the light emitting area comprises a plurality of light emitting sub-areas and the transparent area comprises a plurality of transparent sub-areas, and the light emitting sub-areas and the transparent sub-areas are alternately arranged;
   the light emitting sub-areas have a same structure, and the transparent sub-areas have a same structure; and
   the display portion in each of the light emitting sub-areas comprises two columns of light emitting units, an image displayed by one column of the two columns of light emitting units is transmitted to the left eye of the viewer through the liquid crystal lens layer, and an image displayed by the other column of the two columns of light emitting units is transmitted to the right eye of the viewer through the liquid crystal lens layer.

3. The integrated display panel according to claim 2, wherein each of the light emitting units comprises a driving device and an organic light emitting device coupled to the driving device.

4. The integrated display panel according to claim 3, wherein adjacent organic light emitting devices are spaced apart from each other by a transparent pixel defining layer.

5. The integrated display panel according to claim 1, wherein:
   the polarizing film comprises a composition of dichroic dyes and polymerizable liquid crystal molecules; and
   the first alignment layer has a first alignment direction, the second alignment layer has a second alignment direction, and the second alignment direction is perpendicular to the first alignment direction.

6. The integrated display panel according to claim 5, wherein:
   the polarizing layer further comprises a first phase difference film group, the first phase difference film group comprises a first phase difference film and a third alignment layer, and the first phase difference film and the third alignment layer are at least located in the light emitting area;
   the first phase difference film is located on a side of the first alignment layer close to the transparent display layer;
   the third alignment layer is located on a side of the first phase difference film close to the transparent display layer, and the third alignment layer has a third alignment direction to control a slow axis direction of liquid crystal molecules in the first phase difference film; and
   the third alignment direction is different from the first alignment direction and the second alignment direction.

7. The integrated display panel according to claim 6, wherein:
   the polarizing layer further comprises a second phase difference film group, the second phase difference film group comprises a second phase difference film and a fourth alignment layer, and the second phase difference film and the fourth alignment layer are located at least in the light emitting area;
   the second phase difference film is located on the side of the first alignment layer close to the transparent display layer;
   the fourth alignment layer is located between the first phase difference film and the second phase difference film;
   the fourth alignment layer has a fourth alignment direction to control a slow axis direction of liquid crystal molecules in the second phase difference film; and
   the fourth alignment direction is different from the first alignment direction, the second alignment direction, and the third alignment direction.

8. The integrated display panel according to claim 7, wherein the first phase difference film is a quarter-wave phase difference film, and the second phase difference film is a half-wave phase difference film.

9. The integrated display panel according to claim 7, wherein the first alignment layer, the second alignment layer, the first phase difference film group, and the second phase difference film group are located in the light emitting area and the transparent area.

10. The integrated display panel according to claim 9, further comprising a transparent planarizing player located in the transparent area and formed between the first alignment layer and the second alignment layer.

11. A method for manufacturing an integrated display panel having a light emitting area and a transparent area, comprising:
    forming a transparent display layer comprising a display portion located in the light emitting area and a transparent portion located in the transparent area;
    forming a first alignment layer on the transparent display layer, the first alignment layer located at least in the light emitting area;
    forming a polarizing film on a side of the first alignment layer facing away from the transparent display layer, the polarizing film located in the light emitting area;
    forming a second alignment layer on a side of the polarizing film facing away from the first alignment layer, the second alignment layer located at least in the light emitting area; and forming a liquid crystal lens layer on a side of the second alignment layer facing away from the transparent display layer, the liquid crystal lens layer located in the light emitting area;

wherein an optical axis of liquid crystal molecules in the liquid crystal lens layer and an absorption axis of liquid crystal molecules in the polarizing film are perpendicular to each other; and wherein the polarizing film is configured to absorb external ambient light reflected by the display portion, the liquid crystal lens layer is configured to transmit a left-eye image displayed in the display portion to a left eye of a viewer, and transmit a right-eye image displayed in the display portion to a right eye of the viewer.

12. The method according to claim 11, wherein forming the liquid crystal lens layer on the side of the second alignment layer facing away from the transparent display layer further comprises:

coating a polymerizable liquid crystal mixture on the side of the second alignment layer facing away from the transparent display layer; and forming the liquid crystal lens layer located in the light emitting area by imprinting the polymerizable liquid crystal mixture with a lens model and curing the polymerizable liquid crystal mixture through an ultraviolet curing process.

13. A display device, comprising an integrated display panel having a light emitting area and a transparent area, wherein the integrated display panel comprises:

a transparent display layer comprising a display portion located in the light emitting area and a transparent portion located in the transparent area;

a polarizing layer comprising a first alignment layer and a polarizing film, wherein the first alignment layer is formed on the transparent display layer and is located at least in the light emitting area, and the polarizing film is located in the light emitting area and is formed on a side of the first alignment layer facing away from the transparent display layer; and a liquid crystal lens film layer comprising a second alignment layer and a liquid crystal lens layer, wherein the second alignment layer is formed on the polarizing layer and is located at least in the light emitting area, the liquid crystal lens layer is located in the light emitting area and is formed on a side of the second alignment layer facing away from the transparent display layer; and an optical axis of liquid crystal molecules in the liquid crystal lens layer and an absorption axis of liquid crystal molecules in the polarizing film are perpendicular to each other;

wherein the polarizing film is configured to absorb external ambient light reflected by the display portion; the liquid crystal lens layer is configured to transmit a left-eye image displayed in the display portion to a left eye of a viewer, and transmit a right-eye image displayed in the display portion to a right eye of the viewer.

14. The display device according to claim 13, wherein:
the light emitting area comprises a plurality of light emitting sub-areas and the transparent area comprises a plurality of transparent sub-areas, and the light emitting sub-areas and the transparent sub-areas are alternately arranged;

the light emitting sub-areas have a same structure, and the transparent sub-areas have a same structure; and the display portion in each of the light emitting sub-areas comprises two columns of light emitting units, an image displayed by one column of the two columns of light emitting units is transmitted to the left eye of the viewer through the liquid crystal lens layer, and an image displayed by the other column of the two columns of light emitting units is transmitted to the right eye of the viewer through the liquid crystal lens layer.

15. The display device according to claim 14, wherein each of the light emitting units comprises a driving device and an organic light emitting device coupled to the driving device.

16. The display device according to claim 15, wherein adjacent organic light emitting devices are spaced apart from each other by a transparent pixel defining layer.

17. The display device according to claim 13, wherein:
the polarizing film comprises a composition of dichroic dyes and polymerizable liquid crystal molecules; and
the first alignment layer has a first alignment direction, the second alignment layer has a second alignment direction, and the second alignment direction is perpendicular to the first alignment direction.

18. The display device according to claim 17, wherein:
the polarizing layer further comprises a first phase difference film group, and the first phase difference film group comprises a first phase difference film and a third alignment layer, the first phase difference film and the third alignment layer are at least located in the light emitting area;

the first phase difference film is located on a side of the first alignment layer close to the transparent display layer;

the third alignment layer is located on a side of the first phase difference film close to the transparent display layer, and the third alignment layer has a third alignment direction to control a slow axis direction of liquid crystal molecules in the first phase difference film; and the third alignment direction is different from the first alignment direction and the second alignment direction.

19. The display device according to claim 18, wherein:
the polarizing layer further comprises a second phase difference film group, and the second phase difference film group comprises a second phase difference film and a fourth alignment layer, the second phase difference film and the fourth alignment layer are located at least in the light emitting area;

the second phase difference film is located on the side of the first alignment layer close to the transparent display layer;

the fourth alignment layer is located between the first phase difference film and the second phase difference film;

the fourth alignment layer has a fourth alignment direction to control a slow axis direction of liquid crystal molecules in the second phase difference film; and the fourth alignment direction is different from the first alignment direction, the second alignment direction, and the third alignment direction.

20. The display device according to claim 19, wherein the first phase difference film is a quarter-wave phase difference film, and the second phase difference film is a half-wave phase difference film.

* * * * *